(12) United States Patent
Albrecht et al.

(10) Patent No.: US 7,559,040 B1
(45) Date of Patent: Jul. 7, 2009

(54) OPTIMIZATION OF COMBINATIONAL LOGIC SYNTHESIS THROUGH CLOCK LATENCY SCHEDULING

(75) Inventors: Christoph Albrecht, Berkeley, CA (US); Andreas Kuehlmann, Berkeley, CA (US); David Seibert, Mountain View, CA (US); Sascha Richter, Munich (DE)

(73) Assignee: Cadence Design Systems, Inc., San Jose, CA (US)

( * ) Notice: Subject to any disclaimer, the term of this patent is extended or adjusted under 35 U.S.C. 154(b) by 246 days.

(21) Appl. No.: 11/373,670

(22) Filed: Mar. 10, 2006

Related U.S. Application Data

(63) Continuation-in-part of application No. 11/144,371, filed on Jun. 2, 2005, now abandoned.

(51) Int. Cl.
   *G06F 17/50* (2006.01)
(52) U.S. Cl. ............... 716/2; 716/1; 716/6; 716/12
(58) Field of Classification Search ............... 716/1, 716/2, 6, 12
   See application file for complete search history.

(56) References Cited

U.S. PATENT DOCUMENTS 6,629,312 B1 *  9/2003  Gupta ................... 717/136
7,296,246 B1 * 11/2007  Kuehlmann et al. ......... 716/2

OTHER PUBLICATIONS

Multi-domain clock skew scheduling Ravindran, K.; Kuehlmann, A.; Sentovich, E.; Computer Aided Design, 2003. ICCAD-2003. International Conference on Nov. 9-13, 2003 pp. 801-808.*
Office Action mailed May 8, 2007 for U.S. Appl. No. 11/144,317, filed Jun. 2, 2005, pp. 1-6.
Multi-domain clock skew scheduling; Ravindran, K.; Kuehlmann, A; Sentovich, E.; Computer Aided Design, 2003. ICCAD-2003, International Conference on Nov. 9-13, 2003; pp. 801-808.
Albrecht, C. et al., (Nov. 1999) "Cycle Time and Slack Optimization for VLSI-Chips," Digest of Technical Papers of the IEEE International Conference on Computer-Aided Design, San Jose, California, pp. 232-238.

(Continued)

*Primary Examiner*—Thuan Do
(74) *Attorney, Agent, or Firm*—Duane Morris LLP; Stephen C. Durant

(57) ABSTRACT

In optimizing a design of an integrated circuit, an iteration of a logic optimization process is performed that at least partially optimizes a circuit design such that there is slack remaining in one or more combinational logic paths in the circuit design following the iteration. A clock latency scheduling process is performed that respectively distributes the remaining slack of one or more respective combinational logic paths in the circuit design across respective registers in the circuit design. Another iteration of the logic optimization process is performed that uses at least a portion of the distributed slack to further optimize the circuit design.

37 Claims, 12 Drawing Sheets

OTHER PUBLICATIONS

Albrecht, Christoph et al., (Nov. 2002) "Maximum mean weight cycle in the digraph and minimizing cycle time of a logic chip," Discrete Applied Mathematics, 123: 103-127.

Albrecht, Christoph et al., (Jun. 2004) "Performance and Area Optimization using Sequential Flexibility," Proceedings of the Thirteenth International Workshop on Logic and Synthesis, Temecula, California, Jun. 2-4, 2004, 8 pages.

Berman, Leonard C. et al., (May 1990) "Efficient Techniques for Timing Correction," IEEE International Symposium on Circuits and Systems, New Orleans, Louisiana, pp. 415-419.

Broderson, Robert W. et al., (Nov. 2003) "Methods for True Power Minimization," Digest of Technical Papers of the IEEE International Conference on Computer-Aided Design, San Jose, California, pp. 35-42.

Burns, S. M. (Dec. 1990) "Performance Analysis and Optimization of Asynchronous Circuits," Ph.D. Thesis, California Institute of Technoloby, Pasadena, California.

Dasdan, Ali et al., (1998) "An Experimental Study of Minimum Mean Cycle Algorithms," UCI-ICS Technical Report #98-32, University of Illinois at Urbana-Champaign.

Fishburn, John P. (Jul. 1990) "Clock Skew Optimization," IEEE Transactions on Computers, 39(7): 945-951.

Held, Stephan et al., (Nov. 2003) "Clock Scheduling and Clocktree Construction for High Performance ASICS," Digest of Technical Papers of the IEEE/ACM International Conference on Computer-Aided Design, San Jose, California, pp. 232-239.

Kourtev, Ivan S. et al., (2000) *Timing of Optimization through Clock Skew Scheduling*, Kluwer Academic Publishers, Norwell, Massachusetts, Chapters 4-6, pp. 43-121.

Leiserson, Charles E. et al., (Jan. 1983) "Optimizing Synchronous Systems," Journal of VLSI and Computer Systems, 1(1): 41-67.

Leiserson, Charles E. et al., (1991) "Retiming Synchronous Circuitry," Algorithmica, 6: 5-35.

Malik, Sharad et al., (Jan. 1991) "Retiming and Resynthesis: Optimizing Sequential Networks with Combinational Techniques," IEEE Transactions on Computer-Aided Design, 10(1): 74-84.

Ravindran, Kaushik et al., (Nov. 2003) "Multi-domain Clock Skew Scheduling," Digest of Technical Papers of the IEEE International Conference on Computer-Aided Design, San Jose, California, pp. 801-808.

Young, Neal E. et al., (1991) "Faster Parametric Shortest Path and Minimum-Balance Algorithms," Networks, 21: 205-221.

* cited by examiner

Clock Period = 14

Clock Period = 13

Clock Period = 11.5

Clock Period = 11

Clock Period = 10

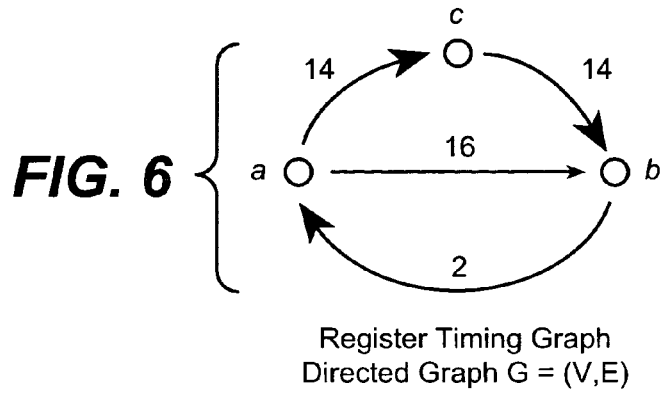
FIG. 6
Register Timing Graph
Directed Graph G = (V,E)
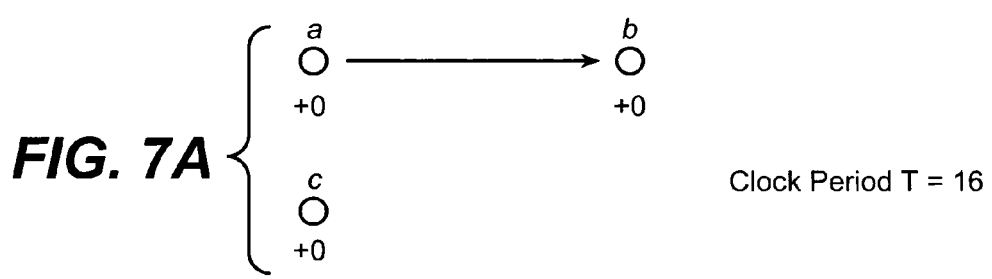
FIG. 7A  Clock Period T = 16
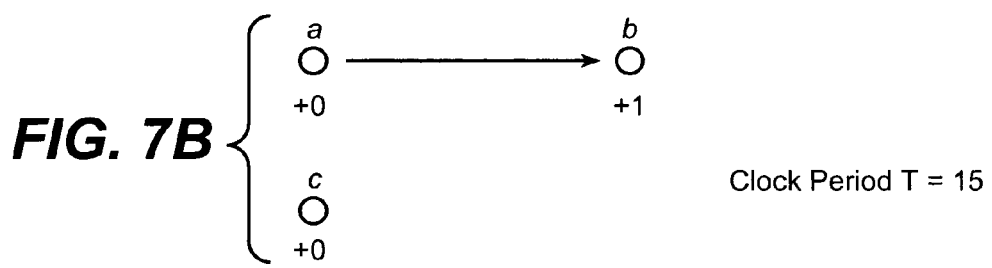
FIG. 7B  Clock Period T = 15
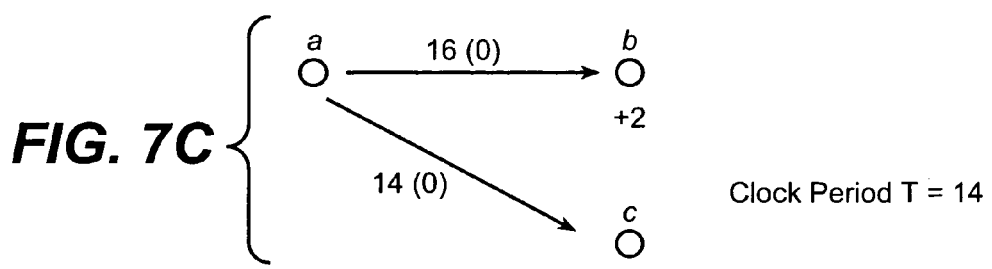
FIG. 7C  Clock Period T = 14

OPTIMIZATION OF COMBINATIONAL LOGIC SYNTHESIS THROUGH CLOCK LATENCY SCHEDULING

CROSS-REFERENCE TO RELATED APPLICATION

This application is a continuation-in-part of pending application Ser. No. 11/144,371 filed Jun. 2, 2005.

BACKGROUND OF THE INVENTION

1. Field of the Invention

The invention relates generally to the design of integrated circuits, and more particularly, to logic optimization and clock latency scheduling during integrated circuit design.

2. Description of the Related Art

Integrated circuit designs often are quite unbalanced with respect to the timing criticality of their logic paths. That is, optimization of combinational logic paths in a circuit design may be limited by critical paths even though there may be room for additional optimization of sequential paths in the same design. As a result traditional synthesis techniques may overdesign combinational logic paths to speed up gates through resizing, for example, which may incur a significant cost in area, even when there is slack in sequential paths in the design.

Sequential optimization techniques have been researched for many years and there are a number of efficient approaches available that are applicable to practical designs. Sequential synthesis methods of practical interest are retiming (see, C. Leiserson and J. Saxe, "Optimizing synchronous systems," Journal of VLSI and Computer Systems, vol. 1, pp. 41 67, January 1983; C. Leiserson and J. Saxe, "Retiming synchronous circuitry," Algorithmica, vol. 6, pp. 5 35, 1991) and clock latency scheduling (see, J. P. Fishburn, "*Clock skew optimization,*" *IEEE Transactions on Computers*, vol. 39, pp. 945 951, July 1990). In both cases, the goal is to balance the path delays between registers and thus to maximize the performance of the design without changing its input/output behavior.

Retiming involves structural transformation that moves the registers in a circuit without changing the positions of the combinational gates. Typical retiming does not address the problem of overdesigned combinational logic paths since commonly used formulations assume a fixed gate timing. For a given set of gate delays retiming ordinarily involves either minimizing the number of registers, maximizing performance, or targeting some combination of the two objectives. Retiming interleaved with synthesis (see, S. Malik, E. M. Sentovich, R. K. Brayton, and A. Sangiovanni-Vincentelli, "Retiming and resynthesis: Optimizing sequential networks with combinational techniques," *IEEE Transactions on Computer-Aided Design*, vol. 10, pp. 74-84, January 1991) can distribute slacks in a limited manner. However, it still applies hard paths partitioning and thus may not predictably balance all slacks.

In contrast to retiming, clock latency scheduling preserves the circuit structure, but applies tuned delays to the register clocks—thus virtually moving them in time. Recently, clock latency scheduling has been adopted in some design flows as a post-layout optimization technique to reduce the cycle time (see, I. S. Kourtev and E. G. Friedman, *Timing Optimization through Clock Skew Scheduling*. Boston, Dortrecht, London: Kluwer Academic Publisher, 2000) and the number of close-to-critical paths (see, C. Albrecht, B. Korte, J. Schietke, and J. Vygen, "Cycle time and slack optimization for VLSI chips," in *Digest of Technical Papers of the IEEE International Conference on Computer-Aided Design*, pp. 232-238, November 1999; S. Held, B. Korte, J. Maβberg, M. Ringe, and J. Vygen, "Clock scheduling and clocktree construction for high-performance ASICs," in *Digest of Technical Papers of the IEEE/ACM International Conference on Computer-Aided Design*, (San Jose, Calif.), pp. 232-239, November 2003). Clock latency scheduling can be viewed as a relaxed form of retiming which is computationally less complex.

Thus, there has been a need to better utilize sequential optimization techniques to further optimize combinational logic synthesis. The present invention meets this need.

SUMMARY OF THE INVENTION

In one aspect of the invention, a method of optimizing a design of an integrated circuit is provided. An iteration of a logic optimization process is performed that at least partially optimizes a circuit design such that there is slack remaining in one or more combinational logic paths in the circuit design following the iteration. A clock latency scheduling process is performed that respectively distributes the remaining slack of one or more respective combinational logic paths in the circuit design across respective registers in the circuit design. Another iteration of the logic optimization process is performed that uses at least a portion of the distributed slack to further optimize the circuit design.

These and other features and advantages of the invention will become apparent from the following detailed description of embodiments thereof in conjunction with the appended drawings.

BRIEF DESCRIPTION OF THE DRAWINGS

FIG. 6 is an illustrative drawing of another directed graph representing another sequential circuit design (not shown).

FIGS. 7A-7F are illustrative drawings showing critical edges and register latencies in the course of clock latency scheduling directed to achieve clock period minimization for the graph of FIG. 6 in accordance with an embodiment of the invention.

DETAILED DESCRIPTION OF THE EMBODIMENTS

Figure 1:
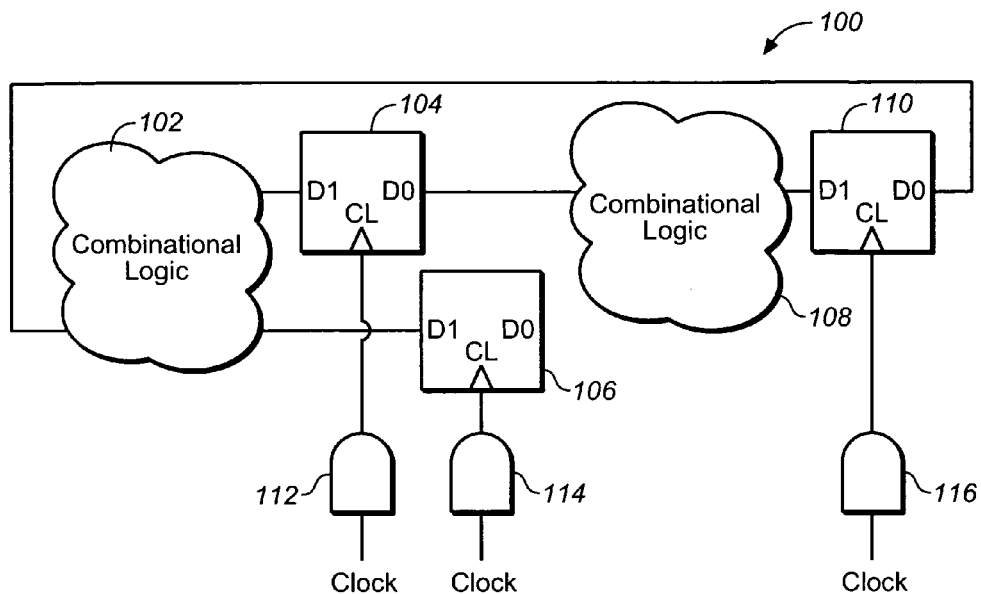
FIG. 1 is an illustrative drawing of a circuit design that includes combinational logic and sequential elements.

The following description is presented to enable any person skilled in the art to make and use the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and devices are shown in block diagram form in order not to obscure the description of the invention with unnecessary detail. Moreover, in order to simplify the description, certain identical components have been labeled with identical reference numerals. Thus, the present invention is not intended to be limited to the embodiments shown, but is to be accorded the widest scope consistent with the principles and features disclosed herein.

Overview of Clock Latency Scheduling

FIG. 1 is an illustrative drawing of a circuit design 100 which includes combinational logic and sequential elements. A first set of combinational logic paths 102 produces inputs to first and second registers (sequential elements) 104, 106. In response to a clock signal (clock), the first and second registers 104, 106 provide respective inputs to a second set of combinational logic paths 108, which produce a data input to a third register 110. In response to the clock signal (clock), the third register 110 feeds back an input to the set of first combinational logic paths 102.

Clock latency of the registers can be adjusted, for example, by changing the arrival time of the clock signal at their respective clock input terminals. More specifically, the first, second and third registers 104, 106 and 110 include a respective Data-in terminals (DI), Data-out terminals (DO) and Clock terminals (CL). Respective buffer circuitry such as respective logic gates 112-116, for example, can be used to adjust the latency of each respective register. For example increasing of buffer circuitry delay has the effect of delaying the arrival of a clock signal (clock) at the Clock terminal of a register so as to increase the latency of the register. Conversely, reduction of buffer circuitry delay has the effect of reducing the clock signal delay, thereby decreasing the latency of the register.

Thus, clock latency of a given register can be adjusted through adjusting its corresponding buffer circuitry delay so as to increase or decrease the latency of the given register by delaying or moving forward the arrival of the clock signal at the register. Increasing the latency of a register has the effect of increasing the slack on combinational logic paths feeding into the Data-in terminal of the register and decreasing the slack on combinational logic paths receiving input from the Data-out terminal of the register. Conversely, decreasing the latency of a register has the effect of decreasing the slack on combinational logic paths feeding into the Data-in terminal of the register and increasing the slack on combinational logic paths receiving input from the Data-out terminal of the register.

Critical Cycle Determination and Latency Scheduling to Achieve Clock Period Minimization A critical cycle in a sequential circuit design or a portion of a sequential circuit design comprises the cycle of registers and combinational logic paths that determines the minimum achievable clock period using only retiming and/or clock latency scheduling techniques. In one embodiment a critical cycle is the cycle with the maximum mean delay computed as (total delay of cycle)/(total number of registers in the cycle).

Figure 2:
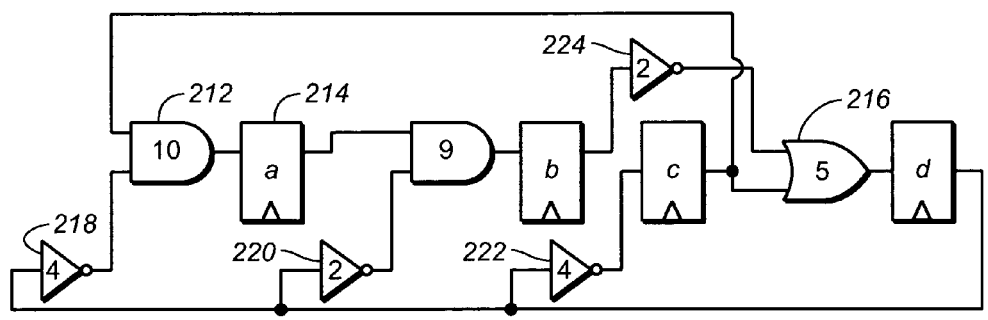
FIG. 2 is an illustrative schematic diagram of a sequential circuit design including multiple cycles.

FIG. 2 is an illustrative schematic diagram of a sequential circuit design 200 including multiple cycles. The illustrative design includes first and second AND logic gates 212, 214, an OR logic gate 216, first through fourth inverter gates 218-224 and first through fourth registers, labeled a-d. The numerals within gates indicate the delay associated with the gates. For example, the first AND gate has a delay of ten time units, and the delay of the fourth inverter 224 is two time units. The size of an individual time unit may be a microsecond, for example. The delay associated with a logic gate can be extracted from a design by a combinational timing analysis tool, for example, which forms no part of the present invention and need not be described herein.

Figure 3:
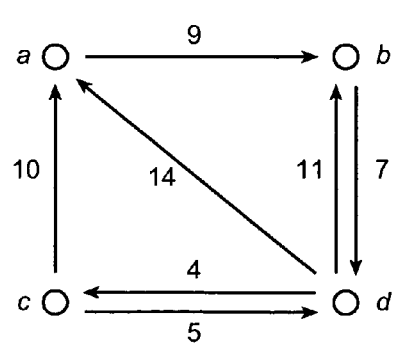
FIG. 3 is an illustrative directed graph showing register timing corresponding to the circuit design of FIG. 2.

FIG. 3 is an illustrative directed graph showing register timing corresponding to the circuit design of FIG. 2. Each vertex in the graph represents an identically labeled register in the circuit design. Vertex a in the graph represents register a in the circuit, for instance. The graph has an edge between two vertices for every combinational logic path between them. Associated with each edge is the maximum delay of all paths between the corresponding registers. For example, the delay of the edge (c, a) is ten time units, which is delay of the combinational logic path consisting of the first AND gate 212 (ten time units), which is interposed between register c and register a. Also, for example, the delay of the edge (d, a) is fourteen time units, which is the delay of the combinational logic path consisting of the first inverter 218 (four time units) and the first AND gate 212 (ten time units). Moreover, there are two paths between register b and register d. These two paths are represented by edge (d, b), which has a delay of eleven time units and by edge (b, d), which has a delay of seven time units. The delay of edge (d, b) is the delay of a combinational path consisting of the second inverter (two time units) and the second AND gate 214 (nine time units). The delay of edge (b, d) is the delay of a combinational logic path consisting of the fourth inverter 224 (four time units) and the OR gate 216 (five units).

Figure 4:
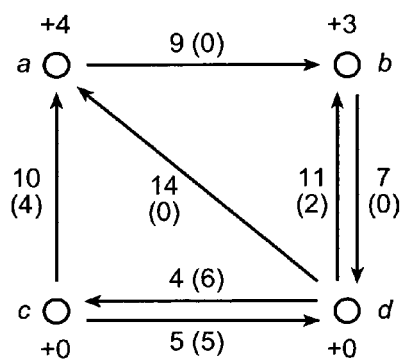
FIG. 4 is an illustrative directed graph showing register timing corresponding to the circuit design of FIG. 2 in which a critical cycle has been optimally scheduled through a clock latency scheduling technique in accordance with an embodiment of the invention.

FIG. 3 is an example of a zero-latency clock schedule, since the latencies of all registers is zero (0). In the graph of FIG. 3, the maximum clock period of the given circuit design is fourteen time units, which is constrained by the delay between register d and a. FIG. 4 is an illustrative directed graph showing register timing corresponding to the circuit design of FIG. 2 in which a critical cycle of the circuit a-b-d-a has been optimally scheduled through a clock latency scheduling technique in accordance with an embodiment of the invention. The respective latencies of the registers are a=4, b=3, c=0, and d=0. These clock latencies are optimal because there is no clock schedule which allows the circuit to be clocked by a faster period. In this example, using these new optimal register latencies, the example circuit can be clocked with a maximum clock period of ten time units. One can easily verify that, given this clock period, each edge in the graph still meets its timing requirements. For example, the edge from d to a still has a delay of fourteen time units, but since the clock at register a is delayed by four (4) time units, any signal along this edge will still meet the setup requirement at register a. The slack of each edge is given in brackets.

Clock latency scheduling to achieve clock period minimization in accordance with an embodiment of the invention now will be explained using the example illustrated in Figures AA1-AA3. For the purpose of this discussion, a register timing graph G=(V, E) can be formally defined as follows. V represents all registers of the design, including additional vertex $v_{ext}$ for all primary inputs and outputs. The directed graph G has an edge (u, v)∈E if and only if there exists a timing path from register u to register v in the circuit. Every edge e=(u, v) is labeled with d(e), the maximum delay between u and v in the circuit. The clock period is denoted by T, and the latency of a register v by l(v).

The problem of latency scheduling to achieve clock period minimization can be stated as follows. Given a register timing graph G=(V, E), with a delay d(e) for all e∈E. Find the latencies l(v) for all v∈V and a clock period T such that $l(u)+d((u,v))-T \leq l(v)$ for all (u,v) (u, v)∈E so as to minimize the clock period T.

Note that since the "latency" at a primary input or primary output cannot be changed, we need to find a solution with $l(v_{est})=0$. However, this does not constrain our problem, since any solution can be transferred to a solution with $l(v_{ext})=0$ by adding a constant to all latencies l(v), v∈V.

Minimum possible clock period is determined based upon timing within a critical cycle. Finding the critical cycle is equivalent to computing the maximum mean cycle (MMC) for G, which is given by $\max_{C \in C} \Sigma_{e \in C} d(e)/|C|$, where C is the set of all cycles in G. The MMC is equal to the minimum clock period which may be obtained using clock latency scheduling. If the delay d(e) of the edges is multiplied by (−1), then finding the maximum mean cycle in the original graph is equivalent to finding the minimum mean cycle in the modified graph. There are several algorithms to compute the minimum mean cycle in a directed graph. An overview and an experimental comparison of the runtime of the different algorithms is given in A. Dasdan, S. S. Irani, and R. K. Gupta, "An experimental study of minimum mean cycle algorithms," Tech. Rep. UCI-ICS 98-32, University of Illinois at Urbana-Champaign, 1998. One embodiment of the invention applies an algorithm by Young, Tarjan and Orlin (see, N. E. Young, R. E. Tarjan, and J. B. Orlin, "Faster parametric shortest path and minimum balance algorithms," *Networks*, vol. 21, no. 2, pp. 205-221, 1991) to compute a critical cycle and the clock schedule. This algorithm is used in (see, C. Albrecht, B. Korte, J. Schietke, and J. Vygen, "Cycle time and slack optimization for VLSI chips," in *Digest of Technical Papers of the IEEE International Conference on Computer-Aided Design*, pp. 232-238, November 1999; C. Albrecht, B. Korte, J. Schietke, and J. Vygen, "Maximum mean weight cycle in a digraph and minimizing cycle time of a logic chip," in *Discrete Applied Mathematics*, vol. 123, pp. 103-127, November 2002) and can be viewed as a modified version of Burn's algorithm (see, S. M. Burns, *Performance Analysis and Optimization of Asynchronous Circuits*. PhD thesis, California Institute of Technology, Pasadena, Calif., December 1991) which is applied in K. Ravindran, A. Kuehlmann, and E. Sentovich, "Multi-domain clock skew scheduling," in *Digest of Technical Papers of the IEEE/ACM International Conference on Computer-Aided Design*, (San Jose, Calif.), pp. 801-808, November 2003.

Clock latency scheduling to achieve clock period minimization algorithm starts with a clock schedule which has a latency of zero for all registers. The clock period is set to the maximum delay of all edges in G. The algorithm decreases the clock period and simultaneously adjusts the latencies in order to keep a feasible clock schedule. It also maintains a set of critical edges which have zero slack.

At the start of the algorithm, the set of critical edges consists only of the edges with the maximum delay. In order to decrease the clock period and to keep a feasible schedule the latencies of all registers which have a critical incoming edge are increased. In case there is a path of critical edges in directed graph G path, $v_1-e_1-v_2, -e_2-v_3-e_3-v_4$, for example, the latency of $v_1$ is not changed, the latency of $v_2$ is increased at the same rate at which the clock period decreases, the latency of $v_3$ is increased at twice the rate of the latency of $v_2$, similarly the latency of $v_4$ increases three times as fast. In general, if the longest path of critical edges directed into vertex v consists of k edges, the latency l(v) is increased at k times the rate at which the clock period decreases. As the rate at which the latency of each register changes is known, it is possible to compute for any non-critical edge the clock period at which the edge becomes critical, assuming there is no other non-critical edge. With this information it is possible to determine the next edge that becomes critical. If a new edge becomes critical, the latency of the vertex into which the edge is directed must increase at a faster rate. Subsequently, a previously critical edge directed into this vertex may become uncritical. The algorithm maintains a set of directed path trees (arborescences) formed by the critical edges.

In one embodiment, the algorithm stores for each vertex v the next incoming edge to become critical together with the corresponding clock period as key in a Fibonacci-Heap. The algorithm stops when the new critical edge forms a directed cycle with the critical edges. This cycle is the maximum mean cycle.

Figure 5A:
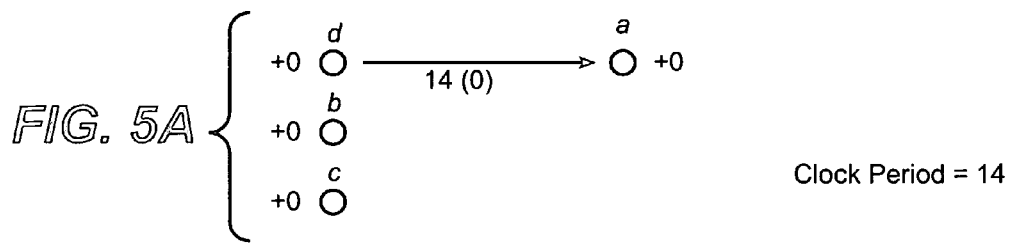
FIGS. 5A-5E are illustrative drawings showing critical edges and register latencies identified in the course of a clock latency scheduling to achieve clock period minimization using the graph of FIG. 3.
Figure 5B:
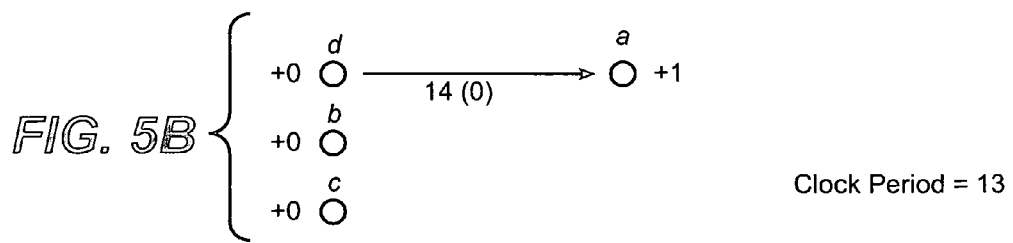
Figure 5C:
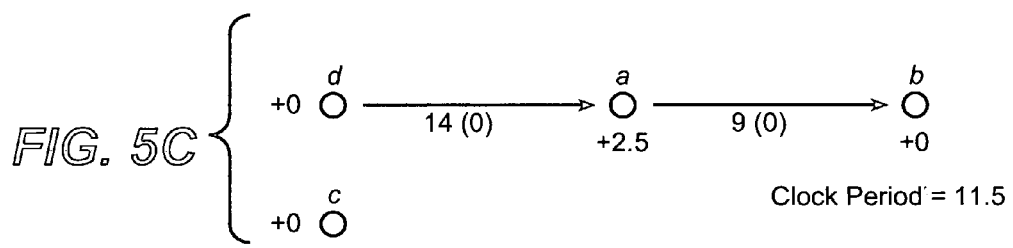
Figure 5D:
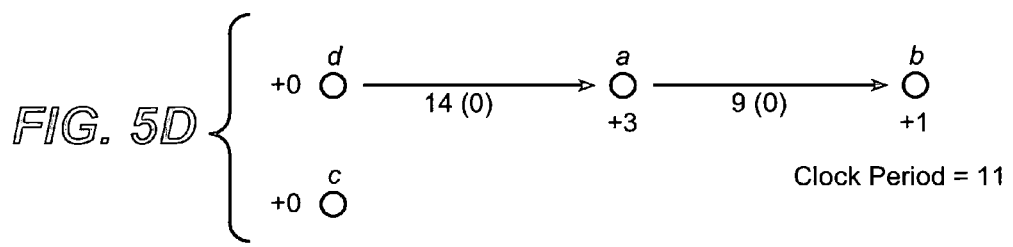
Figure 5E:
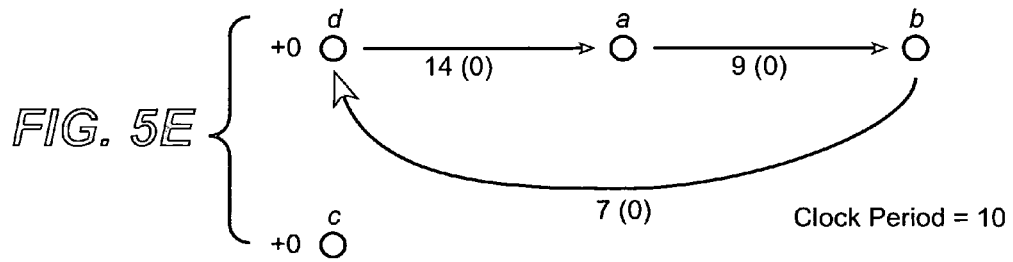

FIGS. 5A-5E are illustrative drawings showing critical edges and register latencies during performance of a clock latency scheduling to achieve clock period minimization using the graph of FIG. 3. FIG. 5A shows the critical edge of the graph of FIG. 3 at the beginning of the clock latency scheduling algorithm. The clock period is selected to be T=14 time units, since path (edge) with the maximum delay (d, a) has a path delay of fourteen time units. FIG. 5B shows the clock latency of register a changed to +1 time units. The clock period can be decreased to T=13. Path (d, a) has slack=0 and is a critical path. FIG. 5C shows the latency of register a increased to +2.5 time units. The clock period can be decreased to T=11.5. Both paths (d, a) and (a, b) have slack=0 and are critical paths. In FIG. 5D, the latency of register a is increased to +3 time units, and the latency of register b is increased to +1 time units. The clock period can be decreased to T=11. Note that the latency of register b increases at twice the rate as the latency of register a. Both paths (d, a) and (a, b) are critical since both have slack=0. In FIG. 5E, the latency of register a is increased to +4, and the latency of register b is increased to +3 time units. The clock period can be decreased to T=10. Once again, the latency of register b increases at twice the rate as the latency of register a. At this point in the register latency scheduling and clock minimization process, paths (d, a), (a, b) and (b, d) of the cycle d-a-b-d are critical since all three have slack=0. Thus, the clock period T=10 time units cannot be reduced any further without increasing slack of at least one of the paths.

Figure 7D:
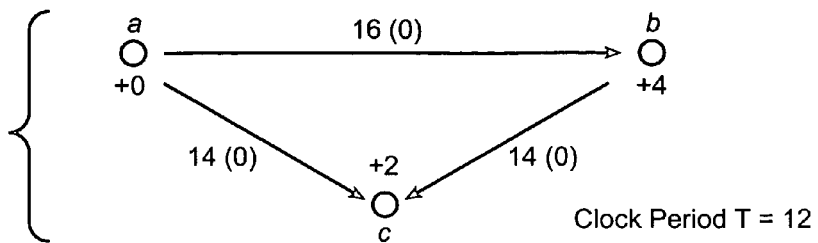
Figure 7E:
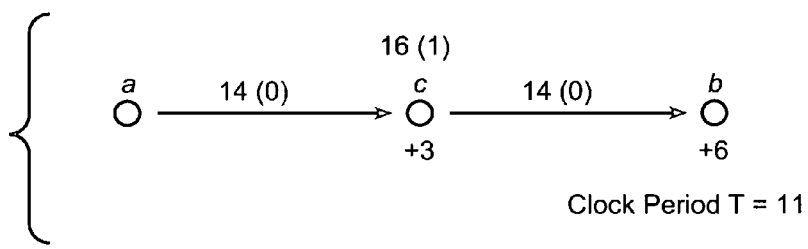
Figure 7F:
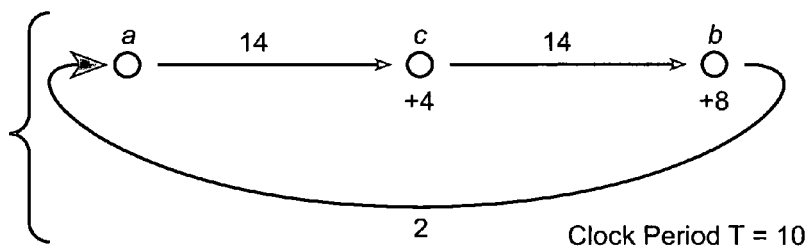

FIG. 6 is an illustrative drawing of another directed graph representing another sequential circuit design (not shown). FIGS. 7A-7F are illustrative drawings showing critical edges and register latencies during performance of a clock latency scheduling algorithm directed to achieve clock period minimization for the graph of FIG. 6 in accordance with an embodiment of the invention. In FIG. 7A, the clock period is selected as T=16, since the path with the maximum delay (a, b) has delay of sixteen time units. In FIG. 7B, the latency of register b is changed to +1, and the clock period is decreased to T=15. Path (a, b) is the only critical path in the directed path tree formed by critical edges. In FIG. 7C, the latency of register b is set to +2, and the clock period is decreased to T=14. The latency of register c is 0. At this point in the clock period minimization process, path (a, c) is added to the tree. Both paths (a, b) and (a, c) are critical, since both have latency=0. In FIG. 7D, the latency of register b is set to +4, and the latency of register c is set to +2. The clock period is decreased to T=12. At this point in the clock minimization process, path (c, b) has been added to the tree, since the latency of each of (a, b), (a, c) and (c, b) is 0. Thus, all paths in the cycle are critical paths. In FIG. 7E, the latency of register c is set to +3, and the latency of register b is set to +6. The clock period is decreased to T=11. Note that the rate of increase in latency of register c is twice that of register b. Also, note that path (a, b) has become uncritical since its slack has increased to +1. Thus, path (a, b) is shown with a dashed line since it no longer is part of the directed path tree formed by critical edges. In FIG. 7F, the latency of register c is set to +4, and the latency of register b is set to +8. The clock period is set to T=10. Path (b, a) is added to the tree since it now has become critical with latency of 0.

Clock Latency Scheduling to Achieve Balanced Slack

In one embodiment, clock latency scheduling aims to optimally distribute the slack among edges in a directed graph representing a circuit design such that slack is balanced and logic synthesis can have more optimization possibilities. It will be appreciated that there may be several different register latency combinations that can achieve the same minimum clock period for a given circuit design. Also, a clock period can be minimized while also balancing slack. The following discussion, defines a slack balancing problem, and introduces a slack balancing algorithm, which extends the clock latency scheduling algorithm described above.

The slack of an edge (u, v) is given by.

$$slack((u,v)) = l(v) - l(u) - d((u,v)) + T.$$

The incoming slack of a register v is the minimum slack of all incoming edges, excluding possible loop edges (v, v), and similarly, the outgoing slack of a register v is the minimum slack of all outgoing edges, excluding loop edges. Loop edges are edges that start and end at the same vertex in a directed graph. Loop edges correspond to combinational logic paths that start and end at the same register in a circuit design represented by the graph.

The above definition is extended to a group of vertices: For $V' \subseteq V$ the incoming slack of V' is, $$slack_{in}(V') = \min_{(u,v) \in E, u \in V \setminus V', v \in V'} slack((u,v)).$$

If V and V' are sets, then V/V' denotes the set that consists of all elements of V but not in V'. The incoming slack of the subset V' is the minimum slack of all the edges for which the start vertex (tail) is not part of V', and the end vertex (head) is part of V'.

Similarly the outgoing slack of V' is, $$slack_{out}(V') = \min_{(v,u) \in E, v \in V \setminus V', u \in V'} slack((v,u)).$$

The outgoing slack of the subset V' is the minimum slack of all the edges for which the start vertex (tail) is part of V', and the end vertex (head) is not part of V'.

A slack balancing problem can be defined as follows.

Given a register timing graph G=(V, E), with a delay d(e) for all e∈E, and a clock period T, find latencies l(v) for all v∈V such that, $$slack_{in}(V') = slack_{out}(V').$$

for all $V' \subset V$, while minimizing the clock period T.

The slack balancing problem is equivalent to the minimum mean balance problem described in N. E. Young, R. E. Tarjan, and J. B. Orlin, "Faster parametric shortest path and minimum balance algorithms," *Networks*, vol. 21, no. 2, pp. 205-221, 1991, which considers an abstract graph theoretical minimum mean balancing problem.

Figure 8:
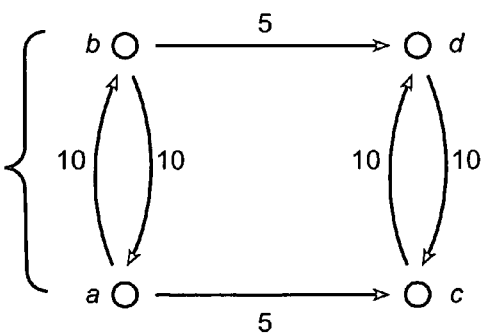
FIG. 8 is an illustrative directed graph representing register timing in a circuit design (not shown) that demonstrates the incoming and outgoing slack of sets of vertices, not merely single vertices, also should be considered in balancing slack.

FIG. 8 is an illustrative directed graph representing register timing in a circuit design (not shown) that demonstrates the incoming and outgoing slack of sets of vertices, not merely single vertices, also should be considered in balancing slack. In this example, assuming that the clock period is T=10, the registers a and b should have the same latency such that the edges (a, b) and (b, a) have zero slack. Similarly, the latencies of the registers c and d should be equal such that the edges (c, d) and (d, c) have zero slack. In this example, for a subset V'={a, b}, Slack$_{in}$(V')=Slack$_{out}$(V')=5 time units. That is, the above-described slack balancing problem requires that the slack of the edges (a, c) and (d, b) be equal. The solution for the slack balancing problem in this example is that the slack of these edges is five (5) and the latencies of all registers are equal.

The following is an algorithm to solve a slack balancing problem in accordance with an embodiment of the invention.

Algorithm 1 Slack Balancing

1: while graph contains directed cycle do

2: find critical cycle C with maximum mean delay

3: assign latencies to C which satisfy timing

4: contract cycle C to a single vertex $v_C$

5: adjust delays on edges directed into and out of $v_C$

6: uncontract graph and compute latencies for all original vertices

The above algorithm takes advantage of the fact that vertices in a critical cycle have their latencies in "lock-step" with each other. That is, such vertices have latencies which are interdependent, and setting the latency for one vertex determines the latencies of all the others in the critical cycle. This is the reason that in each iteration the algorithm contracts the critical cycle C into a single vertex $v_C$. Basically, since all latencies in the critical cycle C are interdependent, the algorithm changes the latency of a single representative (contracted) vertex to fully determine the latencies for all vertices of the entire critical cycle C. Also, the above algorithm adjusts delays for edges directed into and out of $v_C$ to account for the fact that the latencies assigned to the individual vertices in the critical cycle C may be different from each other. That is, the incoming edges to the new (contracted) vertex $v_C$ may, in fact, have pointed to different vertices of C, and this must be reflected in the resulting graph after C is collapsed.

Figure 9A:
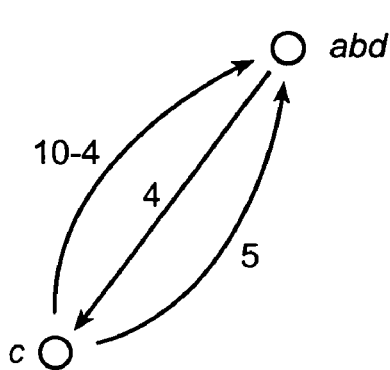
FIGS. 9A-9C are illustrative drawings showing balancing of slack within respect to the critical cycle of the graph of FIG. 4.

Referring again to the illustrative directed graph of FIG. 4, the critical cycle is identified as a-b-d-a, and latencies of (4, 3, 0) are assigned to these vertices. FIG. 9A shows vertices (a, b, d) of FIG. 4 contracted to a single vertex abd. The delays on the edges leading into and out of abd are adjusted as follows. Consider the edge (c, a). Let $\tau_v$ represent the latency assigned to vertex v. Since a was assigned a latency of +4 before being contracted into abd, this vertex may be considered to have a latency of +4 relative to abd, so $$\tau_a = 4 + \tau_{abd} \quad (1)$$

Now suppose the latency of c is set so that the edge (c, a) exactly meets its timing requirements. Then $$\tau_c + 10 - \phi = \tau_a \quad (2)$$

where $\phi$ is the clock period. In addition, the edge (c, abd) should exactly meet its timing requirement, since abd represents a in the contracted graph. This results in:

$$\tau_c + q - \phi = \tau_{abd} \quad (3)$$

where q is the delay assigned to the edge (c, abd). Combining Equations 1 through 3 results in q=6.

Figure 9B:
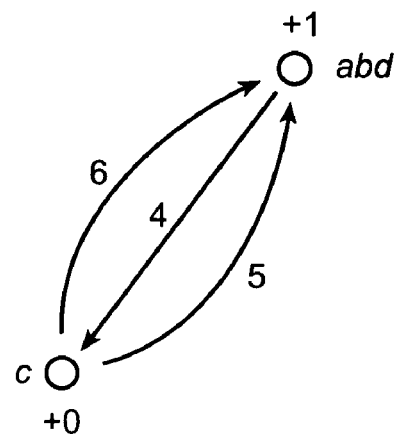

FIG. 9B illustrates results of a procedure for adjusting the edge delays into and out of a contracted vertex in accordance with an embodiment of the invention. Edges directed into a contracted vertex have a value subtracted from their delays, where this value is the latency of the original vertex to which the edge was previously directed relative to the latency of the new vertex. Conversely, edges directed out of the contracted vertex have the corresponding latency added to their delays. Specifically, in this example, the delay of edge (c, abd), which is directed into the contracted vertex is calculated as, 10–4=6, and its slack is (4). The delay of the other edge (c, abd), which is directed into the contracted vertex, is calculated as, 5–0=5, and its slack is (5). The delay of the edge (abd, c), which is directed out of the contracted vertex is calculated as, 4+0=4, and its slack is (6).

FIG. 9B is an illustrative directed graph showing a contracted vertex with new latencies that result in balanced slack. In this example, the new latencies are determined as follows. The latency on vertex abd is increased to +1. The clock period is T=10. The slack of a first edge (c, abd) into the contracted critical cycle vertex abd becomes, l(abd)–l(c)–d(c, (abd)+T=slack(c, abd): 1–0–6+10=5. The slack of (abd, c) out of the contracted critical cycle vertex abd becomes, l(c)–l(abd)–d (abd, c)+T=slack(abd, c): 0–1–4+10–0=5. The slack of a second edge (c, abd) into the contracted critical cycle vertex becomes, l(abd)–l(c)–d(c, abd)'+T=slack(c, abd)': 1–0–5+ 10=6. With these latencies, for each vertex, the worst slack of all outgoing edges (+5) is balanced with the worst slack (+5) of all outgoing edges. Thus, the worst case slack is balanced for edges incoming to the critical cycle and for edges outgoing from the critical cycle.

Figure 9C:
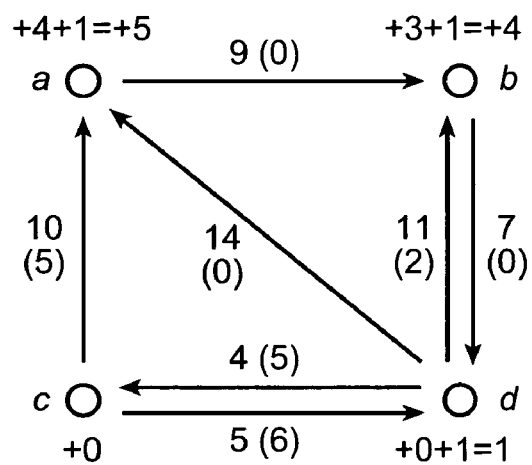

FIG. 9C is an illustrative uncontracted graph in which the latencies of the graph of FIG. 9B are used to determine latencies of the original vertices of the critical cycle C. Since the latency of contracted vertex abd was assigned a value of +1 and vertex a was given a latency of +4 relative to abd (in the iteration that resulted in the graph of FIG. 4), a has an overall latency of +5. Similar computations are done for the other vertices of uncontracted graph. Specifically, the latency of vertex b is calculated as +3+1=+4. The latency of vertex d is calculated as 0+1=+1. The slack of each edge of the solution in FIG. 9C is shown in brackets. The minimum slack into the critical cycle C (+5) on edge (c, a) equals the minimum slack out of the critical cycle C (+5) on edge (c, d).

Thus, the resulting graph in FIG. 9C has the property that for each vertex the worst slack of all incoming edges equals the worst slack of all outgoing edges. Hence the slack is balanced. In the example, the balanced slack algorithm assigns a latency of 0 to register c, balancing the slack such that half of this slack is distributed to the worst outgoing edge (c, a) and the other half to the worst incoming edge (d, c).

For an efficient implementation the algorithm maintains the arborescences formed by the critical edges as the cycle with the current maximum mean delay is contracted. It does not have to start again from the beginning each time a cycle is contracted. It also efficiently updates the rates at which the latencies increase. For further details of the implementation see, N. E. Young, R. E. Tarjan, and J. B. Orlin, "Faster parametric shortest path and minimum balance algorithms," *Networks*, vol. 21, no. 2, pp. 205-221, 1991; C. Albrecht, B. Korte, J. Schietke, and J. Vygen, "Cycle time and slack optimization for VLSI chips," in *Digest of Technical Papers of the IEEE International Conference on Computer-Aided Design*, pp. 232-238, November 1999; C. Albrecht, B. Korte, J. Schietke, and J. Vygen, "Maximum mean weight cycle in a digraph and minimizing cycle time of a logic chip," in *Discrete Applied Mathematics*, vol. 123, pp. 103-127, November 2002. In practice, the algorithm does not need to run until all cycles are contracted, it can be stopped after a certain number of cycles are contracted, or when a certain slack value is achieved.

Clock Latency Scheduling to Improve
Combinational Logic Synthesis

A process involving clock latency scheduling to improve combinational logic synthesis in accordance with an embodiment of the invention proceeds as follows. Circuit timing is analyzed and a register timing graph is extracted. A slack balancing algorithm is used to adjust register latencies. Combinational logic is optimized through a synthesis operation. During synthesis, optimization algorithms of a synthesis tool are applied to the circuit design. In one embodiment, Cadence RTL Compiler serves as the synthesis-tool.

Figure 10A:
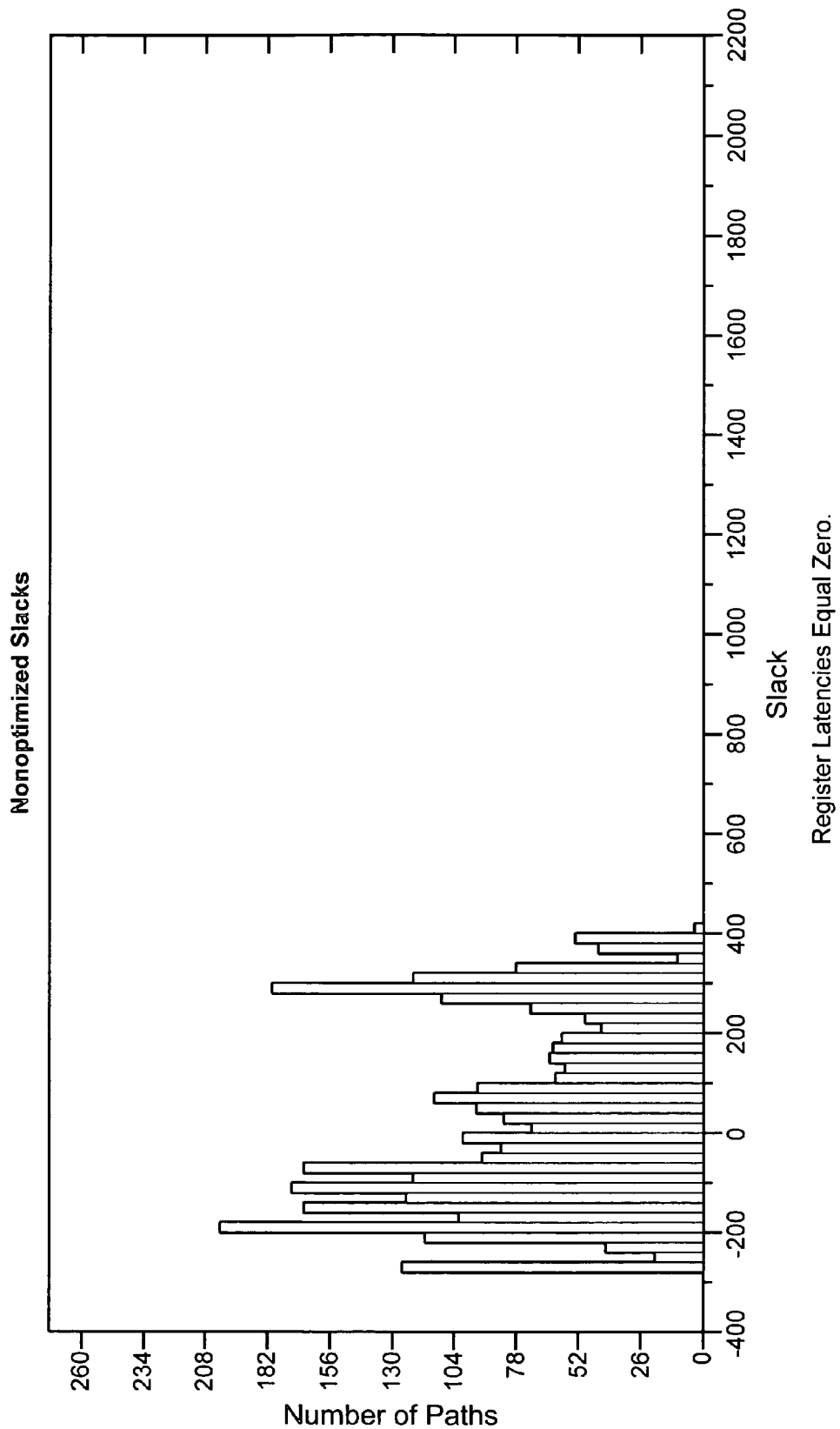
FIGS. 10A-10B show combinational slack distributions for a benchmark design with FIG. 10A and without FIG. 10B clock latencies.
Figure 10B:
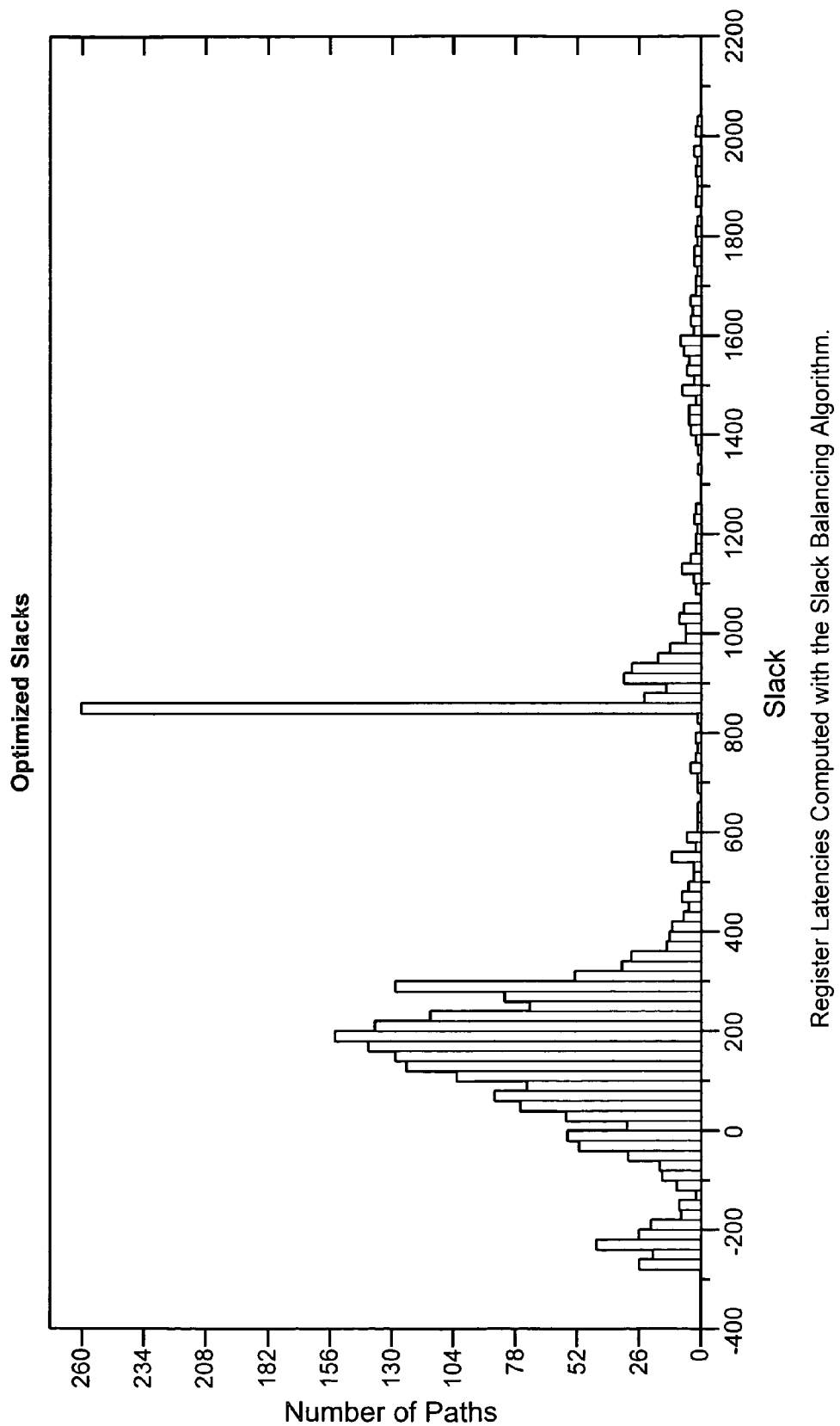

FIGS. 10A-10B shows combinational slack distributions for a benchwork design s13207 (clock period 600 ps) with FIG. 10A and without FIG. 10B clock latencies. The s13207 design has 1,962 gates, 64 primary inputs, 152 primary outputs, 626 flip-flops and 3,146 paths. FIG. 10A depicts the slack distribution of the register-to-register paths in the circuit (paths with over 2200 ps of slack were omitted). As shown, most paths are critical or near-critical in the combinational sense. FIG. 10B gives the distribution of slacks for the same circuit, after clock latencies have been determined for all registers using a balanced slack algorithm described below. For the example, for which the slack distribution is shown in FIG. 10B, the balanced slack algorithm stopped at a slack value of around 850 ps, and hence a large number of paths have this value. Note the strong contrast between the two histograms: the vast majority of the paths which were initially critical can be given significant flexibility using slack balancing through adjusting the register latencies. The following discussion explains an approach to using clock latency scheduling and slack balancing to improve logic optimization in accordance with an embodiment of the invention.

The following algorithm summarizes the process.

Algorithm 2 Sequential Performance Optimization

1: repeat

2: analyze timing and extract register timing graph

3: Slack Balancing (Algorithm 1)

4: synthesize

5: until terminated or no improvement

Figure 11:
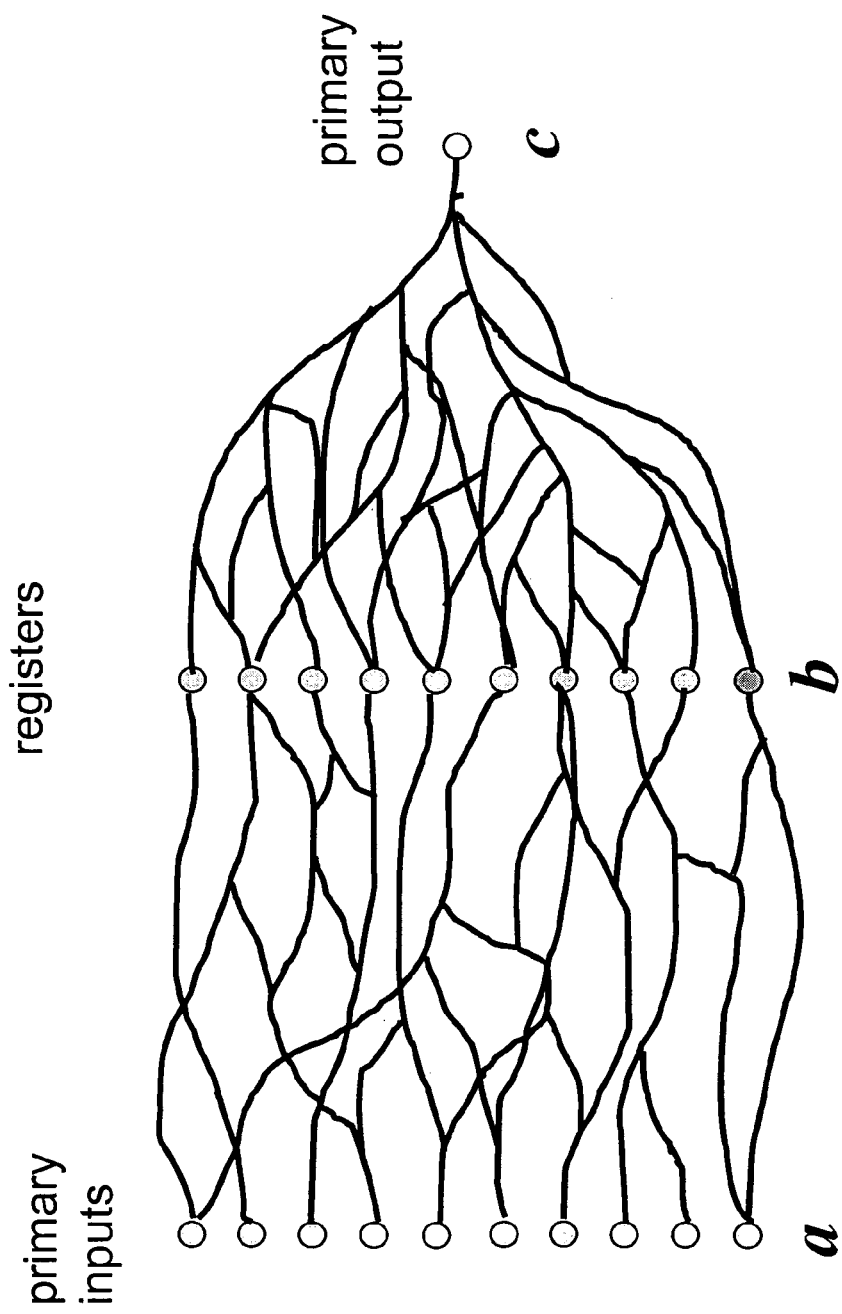
FIG. 11 is an illustrative drawing representing an example of an initial circuit design prior to combinational logic optimization.

FIG. 11 is an illustrative drawing representing an example of an initial circuit design prior to combinational logic optimization. The multiple nodes on the left labeled A represent a set of multiple primary inputs. A primary input is a connection to outside an integrated circuit through which a circuit receives input signals. The single node on the right labeled C represents a primary output. A primary output is a connection through which an integrated circuit provides output to the outside world. The multiple nodes near the center labeled B represent a set of multiple registers. The single node labeled b' represents a register that is on a critical path. A path is called "critical" if it is at or near zero slack. A path may be designated critical even though it is only near, not at, zero slack in order to leave room for process-related variations in the physical implementation, for example.

The branching paths between the primary inputs A and register set B and individual register b' and the branching paths between the register set B and individual register b' and the primary output C represent combinational logic paths that may include combinational logic gates (e.g. AND, OR, INV) and connections among the gates. A combinational logic path starts at a primary input or a register and ends at a register or a primary output. In between the path has only combinational gates and no registers. The complexity of the branching signifies the complexity of the connections and relationships among gates. The details of the circuit design are not important to the invention. At the outset, prior to synthesis all combinational logic paths are viewed as critical paths. This ordinarily is the assumption if a circuit design is to be optimized with endpoint-slack optimization.

The term "logic synthesis" signifies a process used to translate a circuit design from a general description of logic gates and their interconnection to an optimized description of gates and their interconnections. The translation processes may involve one or more sub-processes such as, decomposition (for example Shannon decomposition), extraction, factoring, substitution, reconstitution, elimination, structuring and restructuring, technology mapping, gate sizing, buffer insertion, replication and cloning of gates including characteristics such as gate sizing and logic gates Typically, a synthesis process uses sub-processes such as those listed above to optimize a design based upon several criteria such as timing optimization and area minimization, for example. Timing optimization, for instance, ordinarily involves ensuring that not only do all combinational logic paths satisfy timing requirements determined by the clock period, but also that combinational logic is optimized in that the clock period can be minimized. Area optimization, for example, usually involves structuring logic gates to occupy minimal area consistent with other design requirements such as timing.

On the one hand, slack in a combinational logic path signifies delay, and a synthesis process generally is directed to minimizing critical path delay in a design. On the other hand, slack in a logic path signifies that there may be design room for logic optimization without violating critical path timing requirements. An approach in accordance with one embodiment uses clock latency scheduling to optimize the use of slack in the combinational logic optimization without violating critical path timing requirements.

Figure 12:
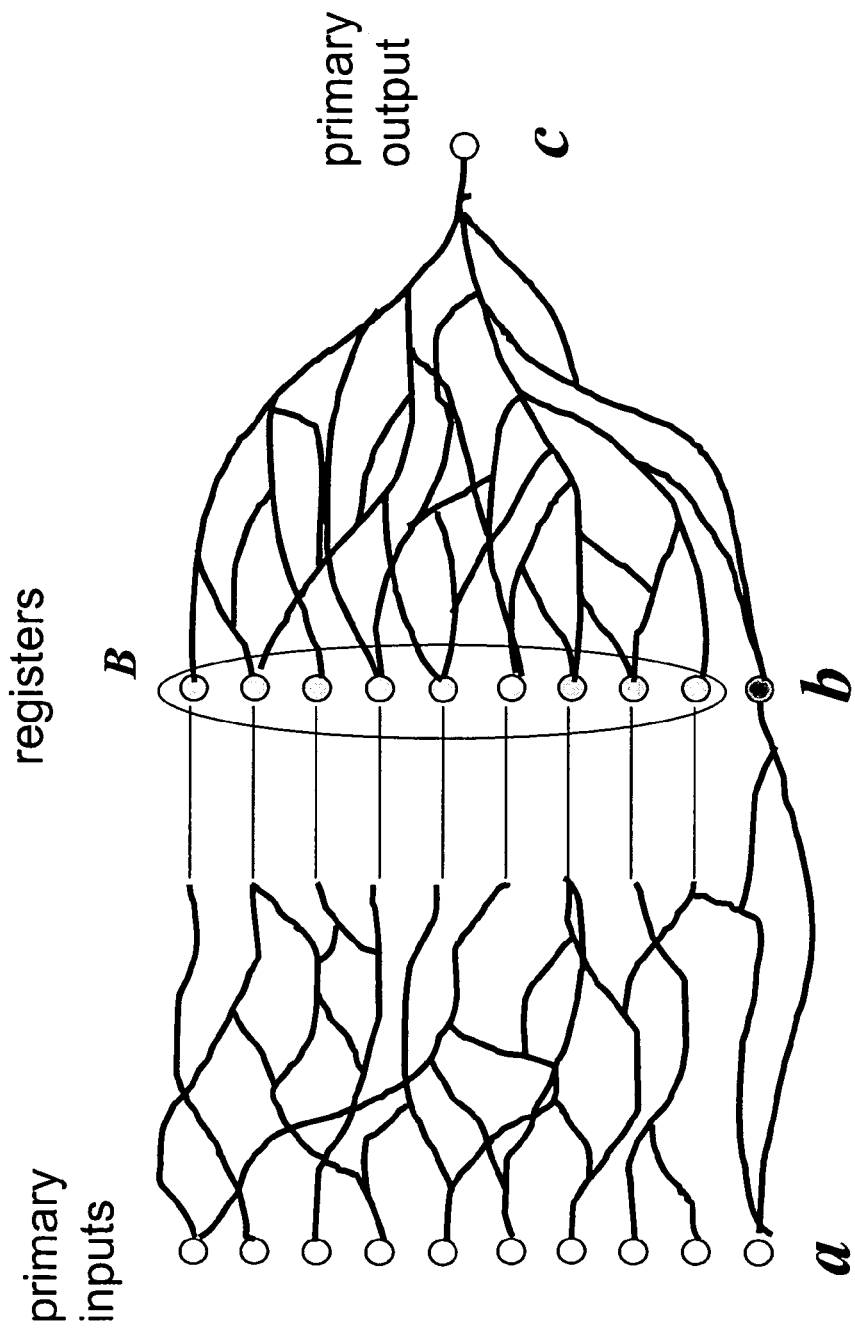
FIG. 12 is an illustrative drawing representing the circuit design of FIG. 11 following an iteration of a logic synthesis process.

FIG. 12 is an illustrative drawing representing the circuit design following an iteration of a logic synthesis process. In one embodiment, a synthesis process called endpoint-slack optimization is used. An endpoint-slack synthesis process first improves the timing of a worst-case path in a circuit design. Once timing of the worst-case path has been optimized, the synthesis process improves timing of other paths in the design.

If the registers all have a latency of zero, the worst-case path, also called a critical path, is the path with the longest timing delay. Following worst-case path optimization in this example, the delay of the critical path from primary inputs A to register b' equals one clock period, and the delay of the critical path from register b' to primary output A equals one clock period. Thus, the logic synthesis iteration illustrated in FIG. 12 is not able to improve the delay of the paths from registers A to critical path register b' and is not able to improve the delay of the paths from critical path register b' to the primary output C.

Next, the endpoint-slack process improves timing of paths from other non-critical paths, e.g. from primary inputs A to registers of the set B. Improved timing means reduced delay in the propagation of signals from the primary inputs A to the primary output C. This improved timing, i.e. reduced delay, is indicated by the parallel straight lines in FIG. 12, which are intended to represent paths having less delay than the branched paths of FIG. 12, which they supplant.

The details of the synthesis process used to optimize the critical path timing and to improve the timing of the other non-critical paths are unimportant to the invention. Persons of ordinary skill in the art will appreciate that there are many different approaches to timing optimization through synthesis. Moreover, the locus of changes in the circuit design that result in timing improvement is unimportant to the invention. For example, the drawings of FIG. 12 indicate that delays on paths to the left of registers of register set B, between primary inputs A and registers B, are reduced, and that delays on branched paths to the right of registers B are unchanged. However, timing may be improved by reducing the delay on any combination of paths between primary inputs A and primary output C that include registers B consistent with principles of the invention.

Following the synthesis process iteration of FIG. 12, there is positive slack available on the non-critical paths. Only the critical paths are without positive slack. The slack of each critical path is zero (0). In this example, there is a critical path from primary inputs A to register b', and there is a critical path from register b' to primary output C.

Thus, at the end of the synthesis iteration shown in FIG. 12, there are combinational logic paths in the design that have slack. However, the clock period cannot be shortened because the critical paths each have no slack. Thus, in this example, at this juncture of the synthesis process, the design cannot be further optimized through combinational logic synthesis alone.

Figure 13:
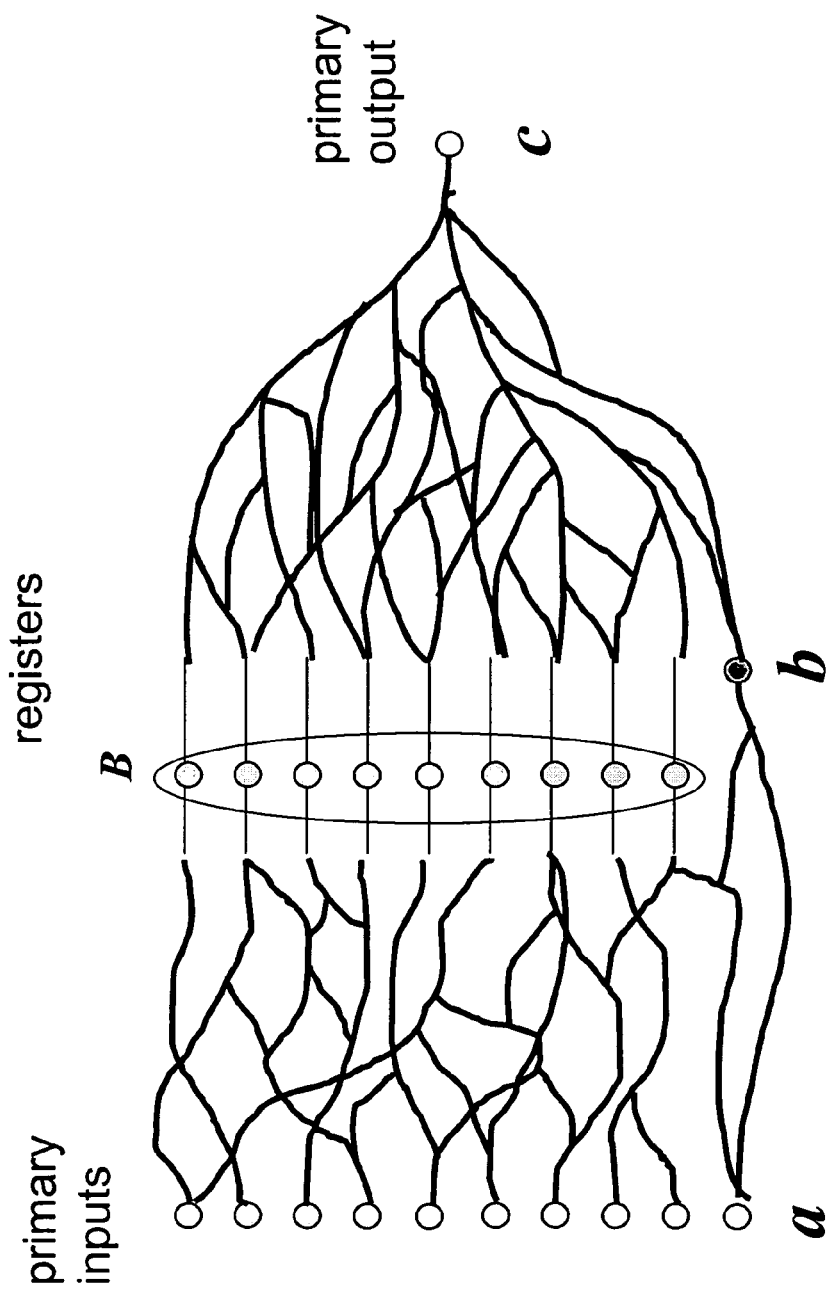
FIG. 13 is an illustrative drawing representing the circuit design of FIG. 11 following a clock latency scheduling iteration to balance slack.

FIG. 13 is an illustrative drawing representing the circuit design following a clock latency scheduling iteration to balance slack. In this example, the clock latency scheduling process does not decrease the clock period, since to do so would compromise timing of the critical paths from primary inputs A to register b', and from register b' to primary output C. It will be appreciated that if the clock period is not changed, then the slack of a path depends on the latencies of the start-register of a given path or end-register of the given path and the delay of the path. Clock latency scheduling cannot change the logic path delay; only logic synthesis can. Clock latency scheduling changes the latencies in order to change and balance the slack.

However, the clock latency scheduling process changes the latencies of the registers in set B in order to balance the slack of each register B so that the worst-case slack of the incoming paths of each register of the register set B is equal to the worst-case slack of the outgoing paths of each register in the register set B. The equal length straight lines on either side of each register in register set B represent this balancing of slack. Thus, for each register in set B, the worst-case slack of the one or more paths from primary inputs A to the register in B is balanced with the worst-case slack of the one or more paths from that register in set B to primary output A.

Although in this example slack is balanced by having worst-case input slack equal worst-case output slack, balancing can be achieved even if the worst-case input and output slacks are not exactly equal and are not completely balanced. For example, an alternative heuristic for adjusting the slack considers each register, and compares its incoming slack and its outgoing slack and changes the latency such that the slacks are equal. When this process converges, the incoming slack is equal to the outgoing slack for every register, but not necessarily does this property hold for every subset of the registers, as it does for the embodiment described above.

Another alternative heuristic for adjusting slack is to select one critical path (for example the path from register b' to primary output C), and to change the latencies with the goal that the side paths of the critical path are relaxed. In the above example, this means the latencies of the registers in set B are decreased until the slack of all incoming paths is zero. The selected path then can be optimized through logic synthesis.

Figure 14:
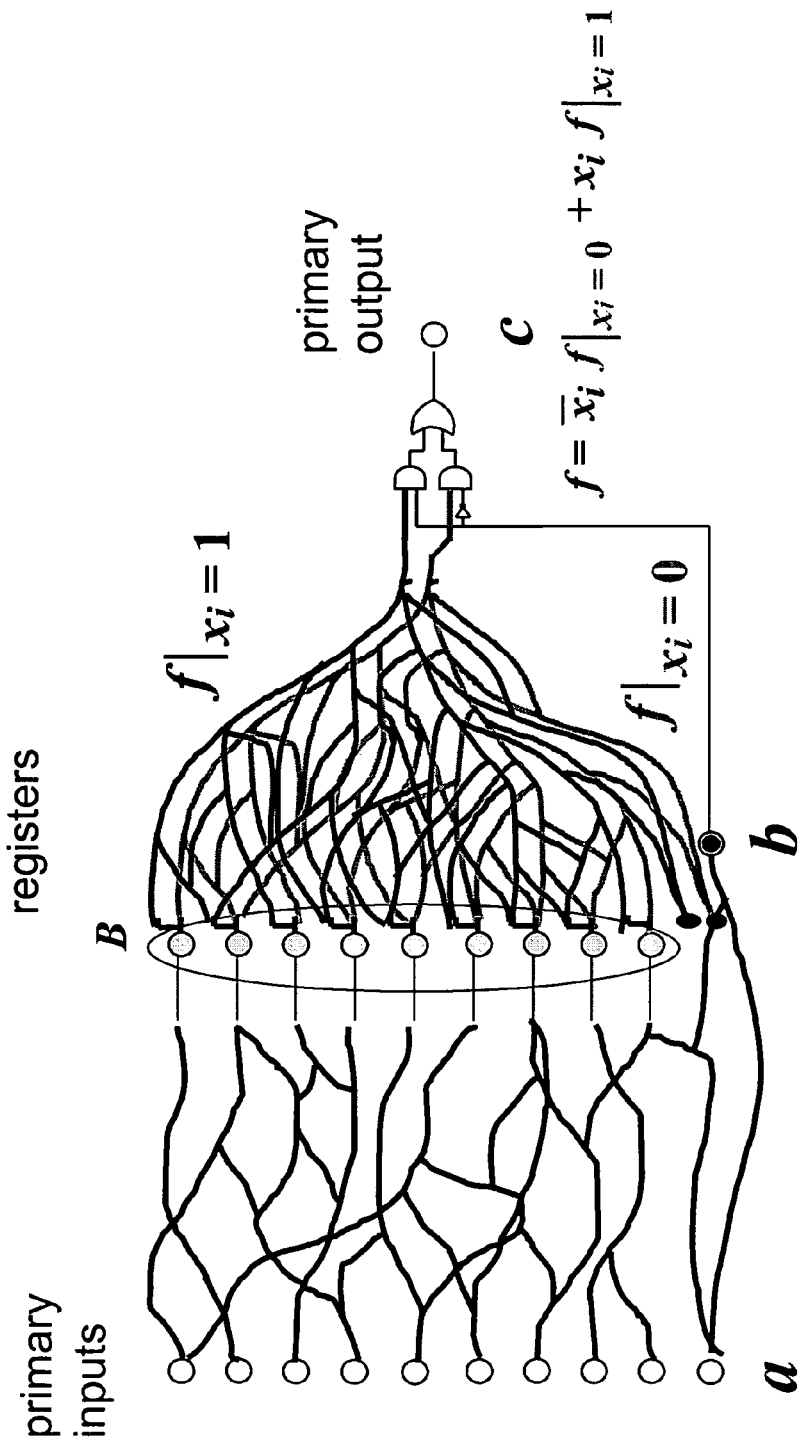
FIG. 14 is an illustrative drawing representing the circuit design of FIG. 11 during another iteration of the synthesis process.
Figure 15:
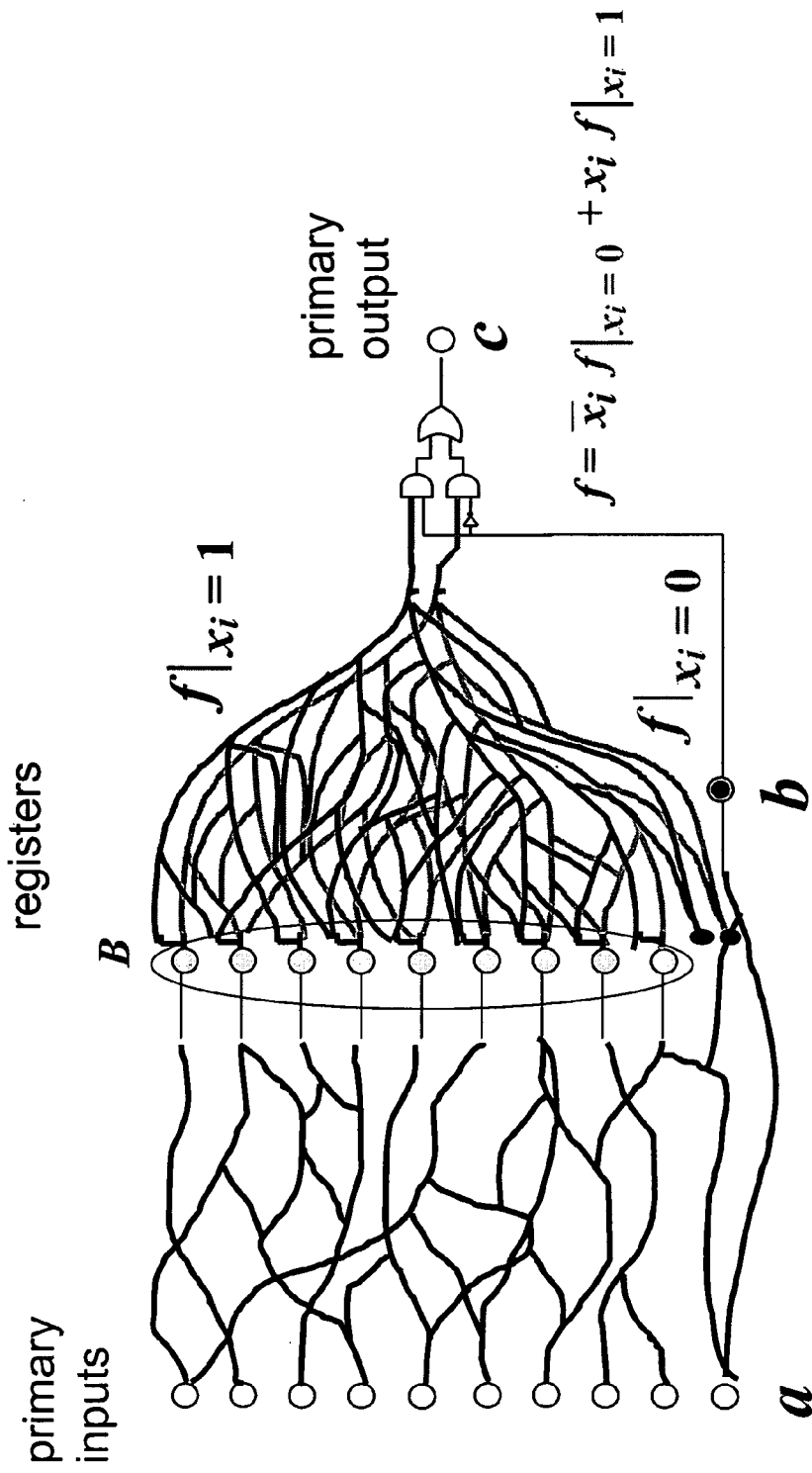
FIG. 15 is an illustrative drawing representing the circuit design of FIG. 11 resulting from another iteration of the clock latency scheduling process.

From the discussion below, it will be appreciated that the slack balancing process iteration of FIG. 13 balances slack remaining in the design after the logic synthesis iteration of FIG. 12. In this example, the slack is "balanced" so as to be distributed about the set of registers B such there is sufficient slack on paths on one side of the registers B between the registers B and the primary output C to permit a subsequent logic synthesis iteration to undertake a Shannon decomposition so as to convert the critical path from register b' to he primary output C to a non-critical path as illustrated in FIG. 14. The slack also is "balanced" so as to be distributed about the registers B such that there is sufficient slack on paths on the other side of the registers B between the primary inputs A and registers B to permit a subsequent iteration of the clock latency scheduling process to reduce the clock period after increasing the latency of register b' as illustrated in FIG. 15.

Note that in this example primary inputs A and a primary output C, for which latency cannot be changed. In one embodiment, a register timing graph (not shown) includes a host node for all primary inputs and primary outputs. In the register timing graph, the latency of the host node and the latency of the node corresponding to register b' are increased (by the same amount since paths (A, b') and (b', C) have the same delay. However, ultimately, the host node must have zero delay. In order to in effect this result, the latencies of all the nodes in the register timing graph (including the host-node) are decreased by the same amount, i.e. the current latency of the host node. Note that this decrease in latency does not change the slack of the edges in the register timing graph.

FIG. 14 is an illustrative drawing representing the circuit design during another iteration of the synthesis process. During this synthesis iteration, the balancing of the combinational logic slack of the paths from the registers of set B to primary output C, during the clock latency scheduling iteration of FIG. 13 provides more options for logic restructuring that can focus on increasing the combinational logic slack on the path from register b' to primary output C.

In this example, the logic function for the primary output C is co-factored with respect to the critical primary input propagated from register b'. More specifically, for example, the synthesis process produces a Shannon decomposition of the output of register b', resulting in a new shorter path from register b' to the primary output C.

The Shannon decomposition illustrated in FIGS. 14-15 in this example involves instantiation of an additional set of gates in the combinational logic paths between the registers B and the primary output C. The instantiation of these adds delay to each of the paths between the registers B and the primary output C. However, the added delay does not result in any of the paths becoming critical, since slack balancing illustrated in FIG. 13 made available additional combinational logic slack on the paths between registers B and primary output C.

Thus, the combinational logic optimization illustrated in FIG. 14 does not necessarily improve the delay of any of the individual paths from registers of set B to the primary output C. In fact, delay probably increases for some or all of those paths due to addition of AND, OR and INV gates in front of the primary output C, for example. Alternatively, delay on some paths from registers of set B to primary output C may be reduced due to simplification of logic paths due to introduction of constants 0 and 1 at the beginning of a path that previously started with register b', for example.

However, during the logic synthesis iteration of FIG. 14, the delay on the path from register b' to primary output C is reduced, such that that path is no longer critical and has positive combinational logic slack. Since the path has positive combinational logic slack it is permissible to increase the latency of the register b' during the next clock latency scheduling iteration, which is what is illustrated in FIG. 15.

FIG. 15 is an illustrative drawing representing the circuit design resulting from another iteration of the clock latency scheduling process. During this next iteration of the clock latency scheduling process, the clock latency of register b' is increased. This increased clock latency is represented by the repositioning of the register b' to the right in the drawing of FIG. 15. The increased clock latency of register b' has the effect of adding combinational logic slack to the path from primary inputs A to register b'.

To summarize, following the synthesis step of FIG. 14, the only critical path in the circuit design is the path from primary inputs A to register b'. In the circuit of FIG. 15, the latency of register b' is increased resulting in combinational logic slack on the path from primary input A to register b', which of course, is therefore no longer critical. Thus, following the logic optimization iteration of FIG. 14 and the clock latency scheduling iteration of FIG. 15, neither the path from primary inputs A to register b' nor the path from register b' to primary output C is critical.

In a next step, which is not shown, the clock latency and scheduling process may decrease the clock period, because every path in the circuit design has positive slack. Thus, the interplay of synthesis process and a clock latency scheduling process produces improved circuit design timing.

Thus, one advantage of one embodiment of the invention is that sequential flexibility can be used to optimize the performance and area during synthesis. For the shown example, without sequential flexibility, synthesis may assume that a large number of paths are close-to-critical, significantly restricting the optimizations scope. By utilizing sequential flexibility during optimization in accordance with an embodiment of the invention, the synthesis search space can be expanded, allowing substantial improvements in the circuit structure and overall gate sizing. This is can be appreciated by noting that gate sizing algorithms may dramatically increase the size of gates on the critical path for ensuring timing closure. For the given example, this would result in a significant number of oversized gates. A dedicated use of clock latencies can relax a large fraction of paths and thus achieve a substantial area savings. Furthermore, the combination of clock latency scheduling and logic restructuring can enhance the circuit performance even in cases where neither of the two methods alone can achieve any improvements.

Clock Latency Scheduling for Improving Power and Area

Changing clock latencies in order to distribute slack is not only useful for decreasing the clock period but also for improving the area of the integrated circuit. If the slack of a critical path is increased this may enable logic synthesis and optimization to synthesize the path with smaller gates which use less power and utilize less area. A gate sizing optimization algorithm may be able to decrease the sizes and similarly some buffers could be removed. In order to achieve area improvements it is necessary that logic synthesis does not perform endpoint slack optimization; instead the primary objective is to minimize the area.

To minimize the clock period and area it is best to use the option for endpoint slack optimization in the first iteration of logic synthesis and optimization and clock latency scheduling, then in the subsequent iteration to optimize for area.

While the invention has been described herein with reference to various illustrative features, aspects and embodiments, it will be appreciated that the invention is susceptible of variations, modifications and other embodiments, other than those specifically shown and described. The invention is therefore to be broadly interpreted and construed as including all such alternative variations, modifications and other embodiments within its spirit and scope as hereinafter claimed.

The invention claimed is:

1. An integrated circuit design optimization method comprising:
using a computer system to perform the steps of:
performing an iteration of a logic optimization process that at least partially optimizes a circuit design such that there is slack remaining in one or more combinational logic paths in the circuit design following the iteration;
performing a clock latency scheduling process that distributes the remaining slack of one or more combinational logic paths in the circuit design across registers in the circuit design;
performing another iteration of the logic optimization process that uses at least a portion of the distributed slack to further optimize the circuit design.

2. The method of claim 1 further including:
performing another iteration of the clock latency scheduling process that distributes the remaining slack of one or more combinational logic paths in the circuit design across registers in the circuit design; and
performing again another iteration of the logic optimization process that uses at least a portion of the distributed slack to further optimize the circuit design.

3. The method of claim 2 further including:
repeating the steps of claim 2 for a prescribed interval or until improvement in optimization drops to a prescribed level.

4. The method of claim 1,
wherein the clock latency scheduling process distributes the remaining slack of one or more combinational logic paths in the circuit design across sets of registers in the circuit design.

5. The method of claim 1 further including:
performing the logic optimization process as part of a synthesis process.

6. An integrated circuit design method comprising:
using a computer system to perform the steps of:
scheduling clock latency of multiple respective registers in the design so as to change distribution of slack among respective combinational logic paths associated with respective registers;
synthesizing combinational logic of the design so as to improve timing performance of the design while reducing slack of at least one respective combinational logic paths on which slack distribution was changed in the clock latency scheduling step.

7. The method of claim 6,
wherein the step of scheduling clock latency balances distribution of slack among the at least two associated paths.

8. The method of claim 6,
wherein the step of synthesizing logic of the design includes optimizing combinational logic in the design so that combinational logic paths in the design satisfy a clock period timing requirement.

9. The method of claim 6,
wherein the step of synthesizing logic of the design includes optimizing combinational logic in the design so as to reduce a clock period time requirement of the design.

10. The method of claim 6,
wherein the step of synthesizing logic of the design includes performing a Shannon decomposition.

11. The method of claim 6,
wherein the step of synthesizing logic of the design includes performing an endpoint-slack optimization.

12. The method of claim 6,
wherein the step of synthesizing logic of the design includes at least one of the following processes: decomposition, extraction, factoring, substitution, reconstitution, elimination, structuring and restructuring, technology mapping, gate sizing, buffer insertion, replication or cloning of gates.

13. The method of claim 6,
after the synthesis step, repeating the clock latency scheduling step; and
after repeating the clock latency scheduling step, repeating the synthesis step.

14. The method of claim 6,
wherein the step of scheduling clock latency, changes distribution of slack among respective associated paths so as to add slack to at least one of respective path associated with a respective register; and wherein the step of synthesizing logic of the design, increases delay of the at least one path to which slack was added in the scheduling step.

15. An integrated circuit design method comprising:
using a computer system to perform the steps of:
scheduling clock latency of at least one register associated with at least two combinational logic paths in which at least one of the two associated paths has positive slack, so as to change a distribution of slack among the at least two associated paths;
synthesizing combinational logic of the design so as to improve timing performance of the design while reducing slack of at least one combinational logic path on which slack distribution was changed in the clock latency scheduling step.

16. The method of claim 15,
wherein the step of scheduling clock latency changes distribution of slack among the at least two associated paths so as to add slack to at least one of the two paths; and
wherein the step of synthesizing logic of the design increases delay of the at least one path to which slack was added in the scheduling step.

17. An integrated circuit design method comprising:
using a computer system to perform the steps of:
synthesizing logic of the design so that combinational logic paths in the design satisfy a clock period timing requirement;
scheduling clock latency of at least one register associated with at least two combinational logic paths in which at least one of the two associated paths has positive slack, so as to change a distribution of slack among the at least two associated paths;
synthesizing combinational logic of the design so as to reduce a clock period time requirement of the design while reducing slack of at least one combinational logic path on which slack distribution was changed in the clock latency scheduling step.

18. The method of claim 17,
wherein synthesizing logic of the design so that combinational logic paths in the design satisfy a clock period timing requirement involves endpoint-slack optimization.

19. The method of claim 17,
wherein synthesizing logic of the design so that combinational logic paths in the design satisfy a clock period timing requirement involves endpoint-slack optimization; and
wherein synthesizing combinational logic of the design so as to reduce a clock period time requirement of the design involves Shannon decomposition.

20. The method of claim 17,
wherein the step of scheduling clock latency balances distribution of slack among respective associated paths.

21. The method of claim 17,
wherein the step of synthesizing logic of the design includes at least one of the following processes: decomposition, extraction, factoring, substitution, reconstitution, elimination, structuring and restructuring, technology mapping, gate sizing, buffer insertion, replication or cloning of gates.

22. An integrated circuit design method comprising:
using a computer system to perform the steps of:
scheduling clock latency of multiple respective registers in the design so as to change distribution of slack among respective combinational logic paths associated with respective registers;
synthesizing combinational logic of the design so as to reduce area of the design while reducing slack of at least one respective combinational logic paths on which slack distribution was changed in the clock latency scheduling step.

23. The method of claim 22,
wherein the step of scheduling clock latency, changes distribution of slack among respective associated paths so as to add slack to at least one of respective path associated with a respective register; and
wherein the step of synthesizing logic of the design, increases delay of the at least one path to which slack was added in the scheduling step.

24. The method of claim 22,
wherein the step of scheduling clock latency balances distribution of slack among respective associated paths.

25. The method of claim 22 further including:
before the clock latency scheduling step, synthesizing combinational logic of the design so as to improve timing performance of the design.

26. The method of claim 22 further including:
before the clock latency scheduling step, synthesizing combinational logic of the design by performing an endpoint-slack optimization.

27. The method of claim 22,
wherein the step of synthesizing logic of the design includes at least one of the following processes: decomposition, extraction, factoring, substitution, reconstitution, elimination, structuring and restructuring, technology mapping, gate sizing, buffer insertion, replication or cloning of gates.

28. An integrated circuit design method comprising:
using a computer system to perform the steps of:
scheduling clock latency of at least one register associated with at least two combinational logic paths in which at least one of the two associated paths has positive slack, so as to change a distribution of slack among the at least two associated paths;
synthesizing combinational logic of the design so as to reduce area of the design while reducing slack of at least one combinational logic path on which slack distribution was changed in the clock latency scheduling step.

29. The method of claim 28,
wherein the step of scheduling clock latency, changes distribution of slack among the at least two associated paths so as to add slack to at least one of the two paths; and
wherein the step of synthesizing logic of the design, increases delay of the at least one path to which slack was added in the scheduling step.

30. The method of claim 28,
wherein the step of scheduling clock latency, balances distribution of slack among the at least two associated paths.

31. The method of claim 28,
wherein synthesizing combinational logic of the design so as to reduce area of the design includes structuring logic gates to occupy minimal area consistent with timing requirements.

32. An integrated circuit design method comprising:
using a computer system to perform the steps of:
scheduling clock latency of at least one register associated with at least two combinational logic paths in which at least one of the two associated paths has positive slack, so as to change a distribution of slack among the at least two associated paths;
synthesizing combinational logic of the design so as to improve timing performance of the design while reducing slack of at least one combinational logic path on which slack distribution was changed in the clock latency scheduling step;

repeating the clock latency scheduling step;

synthesizing combinational logic of the design so as to reduce area of the design while reducing slack of at least one combinational logic path on which slack distribution was changed in the repeat of the clock latency scheduling step.

33. The method of claim 32,
wherein the step of synthesizing combinational logic of the design so as to improve timing performance of the design includes optimizing combinational logic in the design so that combinational logic paths in the design satisfy a clock period timing requirement.

34. The method of claim 32,
wherein the step of synthesizing combinational logic of the design so as to improve timing performance of the design includes optimizing combinational logic in the design so as to reduce a clock period time requirement of the design.

35. The method of claim 32,
wherein the step of synthesizing combinational logic of the design so as to improve timing performance of the design includes performing a Shannon decomposition.

36. The method of claim 32,
wherein the step of synthesizing combinational logic of the design so as to improve timing performance of the design includes performing an endpoint-slack optimization.

37. The method of claim 32,
wherein the step of synthesizing logic of the design includes at least one of the following processes: decomposition, extraction, factoring, substitution, reconstitution, elimination, structuring and restructuring, technology mapping, gate sizing, buffer insertion, replication or cloning of gates; and wherein synthesizing combinational logic of the design so as to reduce area of the design includes structuring logic gates to occupy minimal area consistent with timing requirements.

* * * * *